(12) United States Patent
Leung et al.

(10) Patent No.: US 6,313,008 B1
(45) Date of Patent: Nov. 6, 2001

(54) METHOD TO FORM A BALLOON SHAPED STI USING A MICRO MACHINING TECHNIQUE TO REMOVE HEAVILY DOPED SILICON

(75) Inventors: Ying Keung Leung, Hong Kong (CN); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan; James Yong Meng Lee, both of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/768,486

(22) Filed: Jan. 25, 2001

(51) Int. Cl.$^7$ .................................................... H01L 21/76
(52) U.S. Cl. .......................... 438/424; 438/296; 438/433; 257/510
(58) Field of Search .................................. 438/424, 427, 438/433, 435, 296; 257/510

(56) References Cited

U.S. PATENT DOCUMENTS

| | | | |
|---|---|---|---|
| 4,533,430 | * 8/1985 | Bower | 438/424 |
| 4,853,348 | 8/1989 | Tsubouchi et al. | 437/203 |
| 5,112,771 | 5/1992 | Ishii et al. | 437/67 |
| 5,432,365 | 7/1995 | Chin et al. | 257/301 |
| 5,629,226 | 5/1997 | Ohtsuki | 438/389 |
| 5,668,044 | 9/1997 | Ohno | 438/433 |
| 5,915,192 | * 6/1999 | Liaw et al. | 438/435 |
| 5,943,581 | 8/1999 | Lu et al. | 438/386 |
| 5,972,758 | 10/1999 | Liang | 438/294 |
| 6,004,864 | 12/1999 | Huang et al. | 438/433 |
| 6,020,250 | 2/2000 | Kenney | 438/422 |
| 6,232,202 | * 5/2001 | Hong | 438/424 |
| 6,251,750 | * 6/2001 | Lee | 438/432 |

FOREIGN PATENT DOCUMENTS

| | | | | |
|---|---|---|---|---|
| 000413040A1 | * | 2/1991 | (EP) | G01N/27/00 |
| WO 01/29897 A1 | * | 4/2001 | (WO) | H01L/29/78 |

* cited by examiner

Primary Examiner—Charles Bowers
Assistant Examiner—David S Blum
(74) Attorney, Agent, or Firm—George O. Saile; Rosemary L. S. Pike; William J. Stoffel

(57) ABSTRACT

The invention describes three embodiments of methods for forming a balloon shaped STI trench. The first embodiment begins by forming a barrier layer over a substrate. An isolation opening is formed in the barrier layer. Next, ions are implanted into said substrate through said isolation opening to form a Si damaged or doped first region. The first region is selectively etching to form a hole. The hole is filled with an insulating material to form a balloon shaped shallow trench isolation (STI) region. The substrate has active areas between said balloon shaped shallow trench isolation (STI) regions. The second embodiment differs from the first embodiment by forming a trench in the substrate before the implant. The third embodiment forms a liner in the trench before an isotropic etch of the substrate through the trench.

30 Claims, 5 Drawing Sheets

METHOD TO FORM A BALLOON SHAPED STI USING A MICRO MACHINING TECHNIQUE TO REMOVE HEAVILY DOPED SILICON

BACKGROUND OF INVENTION

1) Field of the Invention

This invention relates generally to fabrication of semiconductor devices and more particularly to the processes for forming field isolations or shallow trench isolation (STI).

2) Description of the Prior Art

The method of local oxidation of silicon(LOCOS) to form field oxide isolation around semiconductive devices built into the surface of silicon wafers has been practiced for over twenty-five years and has been adapted to many specific applications. In the process, a non-oxidizable mask of silicon nitride is formed over a thin layer of pad oxide grown on a blank silicon wafer. The mask is patterned by well known photolithographic methods and the wafer is oxidized, typically in steam, at temperatures in the neighborhood of 1,000° C. The mask is patterned so that, after oxidation, mesa like regions of silicon are surrounded by a region of silicon oxide insulation. The semiconductive devices are then formed on the silicon mesas. Over the years many problems with LOCOS have surfaced which have been addressed in a great variety of ways. Most notable are the problems which deal with the growth of oxide under the mask(birds beak) and the resultant uneven surface topology over the field oxide.

A promising replacement for LOCOS field oxide isolation has been found in trench isolation. Although deep trench isolation(DTI) has been used nearly as long as LOCOS for bipolar transistor isolation, it has not been widely practiced in the manufacture of MOSFET integrated circuits. More recently, however, as device densities increase and isolation widths become smaller, shallow trench isolation(STI) is gaining favor over LOCOS in MOSFET technology.

The trenches are formed in the silicon around the semiconductor devices by reactive ion etching. They are then filled either entirely with silicon oxide or lined with silicon oxide and filled with another material such as polysilicon.

A major problem the inventor's have realized, as the scale of the devices shrinks, the width/area of the STI at the chip surface is to large, thus using up valuable active area. In addition, the isolation of logic device is not good enough at a feature size less than 0.18 $\mu$m using conventional STI because the STI is too narrow below the wafer surface.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,688,044(Ohno) shows dope by I/I and isotropic etch.

U.S. Pat. No. 6,004,864(Huang et al.) show an isolation process.

U.S. Pat. No. 5,629,226(Ohtsuki) shows a trench etch, dope and etch.

U.S. Pat. No. 5,943,581(Lu et al.) shows an isotropic etch of a doped area to form a round trench.

U.S. Pat. No. 6,020,250(Kenney) shows a process for horizontal trenches.

U.S. Pat. No. 5,972,758(Liang) shows a STI trench.

U.S. Pat. No. 5,112,771(Ishii et al.) shows a round STI trench.

U.S. Pat. No. 5,432,365(Chin et al.) shows a shaped trench for a capacitor.

U.S. Pat. No. 4,853,348(Tsuboushi et al.) shows a shaped trench for a capacitor.

SUMMARY OF THE INVENTION

It is an object of the present invention to provide a method for fabricating a balloon shaped shallow trench isolation (STI).

It is an object of the present invention to provide a method for fabricating a balloon shaped shallow trench isolation (STI) where the top of the STI is narrower than the lower portions of the STI so that active areas is conserved and isolation is improved.

It is an object of the present invention to provide a method for fabricating a balloon shaped shallow trench isolation (STI) for CMOS devices with feature sizes less than 0.18 $\mu$m.

To accomplish the above objectives, the present invention provides a method of manufacturing a STI having a balloon shape.

The invention describes three preferred embodiments of methods for forming a balloon shaped STI trench.

A first general embodiment of the invention of a method of fabricating a balloon shaped shallow trench isolation (STI); comprising the following steps. A barrier layer is formed over a substrate. We form an isolation opening in said barrier layer. Next, ions are implanted into said substrate through said isolation opening to form a doped region. The doped region is selectively etching to form a hole. The hole is filled with a insulating material to form a balloon shaped shallow trench isolation (STI) region. The substrate has active areas between said balloon shaped shallow trench isolation (STI) regions.

The second embodiment differs from the first embodiment by forming a trench in the substrate before an ion implant.

The third embodiment forms a liner in the trench before optional Ion implantation.

It is a preferred option in all three embodiments that CMOS logic FET devices are formed on the active areas between the shallow trench isolation (STI). The inventor have found that the invention's Balloon shape STIs have an advantage in forming logic FET devices because the distance carriers have to travel to cause isolation failure is longer. In particular, logic devices with feature sizes less than 0.18 $\mu$ms (e.g., STI width and dimensions of gate and Source/drains are helped by the invention.

This is an important understanding because the prior art forms memory devices with unusual shaped STI structures, but form memory devices and do not specifically form logic devices.

Another critical feature of the invention is that the STI region is narrower at the top (near the substrate surface) than below the surface (more than 0.2 $\mu$m below). For example, the balloon shaped shallow trench isolation (STI) regions is narrower at a depth of about 0.1 $\mu$m (.e.g., near the surface) between the surface of the substrate than at the at a depth of about 0.2 $\mu$m.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

I. $1^{st}$ Embodiment—FIGS. 1 to 4—Balloon Shaped STI

The present invention will be described in detail with reference to the accompanying drawings. The present invention provides a method of forming a balloon shaped shallow trench isolation (STI).

Figure 1:
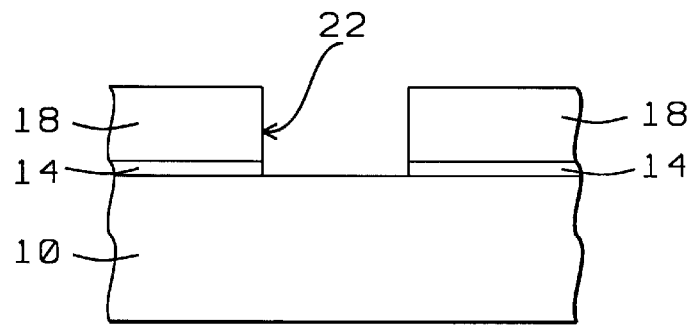
FIGS. 1 through 4 are cross sectional views for illustrating a first embodiment for manufacturing a balloon shaped shallow trench isolation (STI) region according to the present invention.
Figure 2:
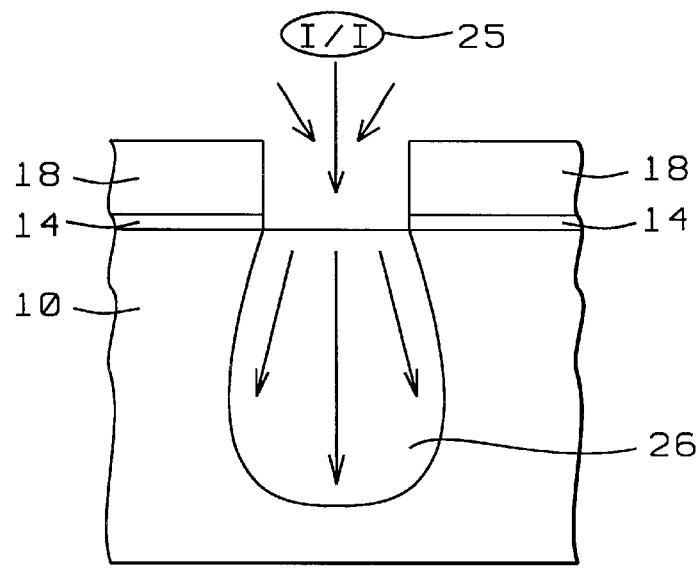

A. FIG. 1 Forming Barrier Layer 14 18

As shown in FIG. 1, a barrier layer 14 18 is formed over a substrate 10. The substrate may be a conventional Si substrate or a SIO substrate or any substrate using in semiconductor manufacturing.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers, The barrier layer is preferably comprised of a pad oxide layer 14 with an overlying nitride layer 18. The barrier layer can be comprised of one layer or more than one layer. The barrier layer must be a mask for subsequent ion implants (I/I) and chemical vapor depositions.

B. Isolation Opening 22

An isolation opening 22 is formed in the barrier layer 14 18. The isolation opening preferably has a width of between about 0.1 and 10 $\mu$m. The isolation opening can be formed by a conventional photolithographic process.

C. Implanting Ions to Form a Doped Region 26

Next, ions 25 are implanted into the substrate through the isolation opening 22. The implant can be of a dopant to dope the substrate which creates a first (e.g., doped area or amorphized) that has a faster etch rate. Alternatively, the implant can be of an ion that causes crystalline damaged (amorphized) region 26 which has a faster etch rate that crystalline areas. The substrate is preferably silicon.

For the implant of a dopant, the ions are preferably boron ions. The implanting of ions 25 into the substrate preferably comprises implanting boron ions at an energy between about 10 and 50 Kev; at a dose between 5E14 and 5E15 ions/$cm^2$; and at an angle (to vertical) between 0 and 30 degrees and more preferably between 5 and 30 degrees.

The doped or crystalline damaged region 26 preferably has a depth in a range of between about 0.2 and 0.4 $\mu$m and a concentration in a range of between about 1E19 and 1E20 atom/cc.

D. Selectively Etching the Doped Region 26 to Form a Hole 30

Figure 3:
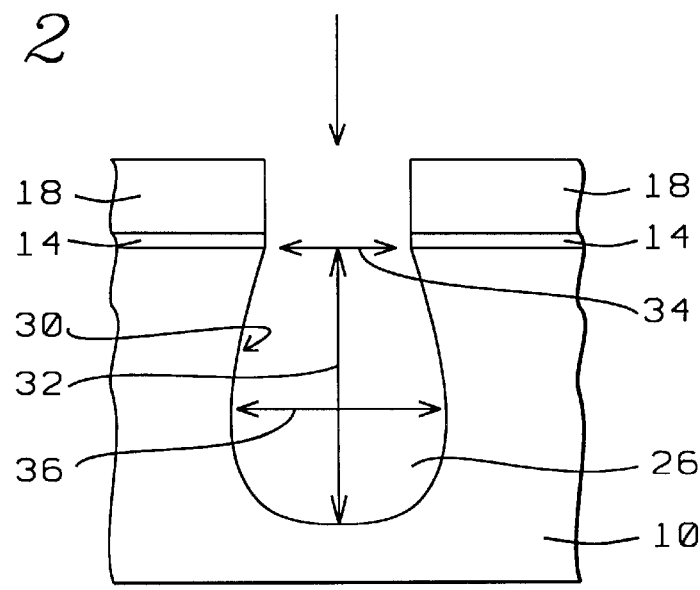

As shown in FIG. 3, we selectively etch the doped region 26 to form a hole 30. The selective etch is preferably HF/HNO3?$CH_3COOH$ (1:3:8 ration) for boron doped region and a KOH/IPA.(isopropyl alcohol) for amorphized Si.

The hole 30 preferably has a depth 32 in a range of between about 0.2 and 0.4 $\mu$m and a maximum width 36 of between about 0.1 and 0.2 $\mu$m bigger that width 34 (width at the surface); and a width 34 at the substrate surface between 0.1 and 10 $\mu$m.

E. Fill Hole 30 with Oxide

Figure 4:
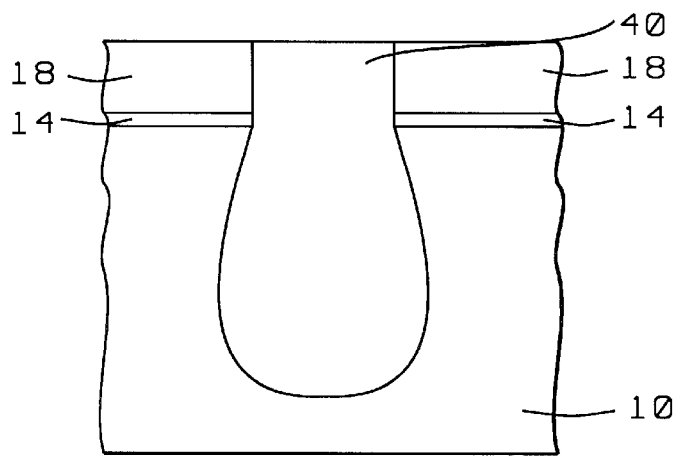

As shown in FIG. 4, we fill the hole 30 with an insulating material to form a balloon shaped shallow trench isolation (STI) region 40. The hole 30 is filled with oxide using a HDPCVD process.

II. $2^{nd}$ Embodiment—(FIGS. 5 to 7)

Figure 5:
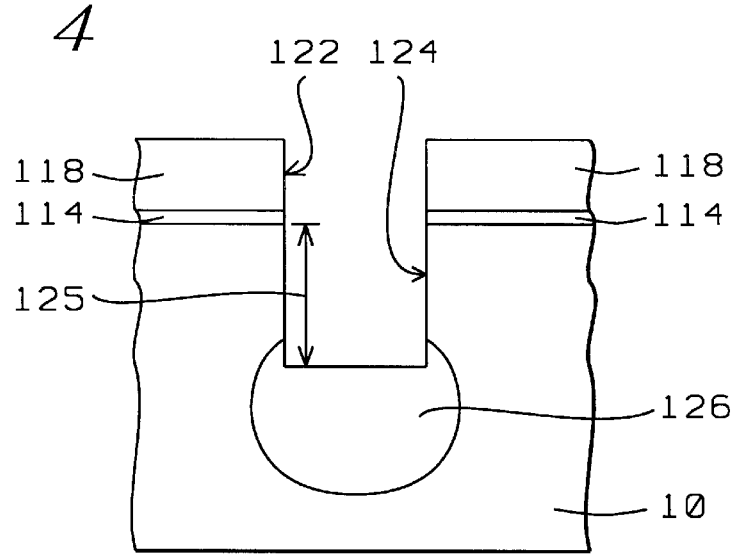
FIGS. 5 through 7 are cross sectional views for illustrating a second embodiment for manufacturing a balloon shaped shallow trench isolation (STI) region according to the present invention.
Figure 6:
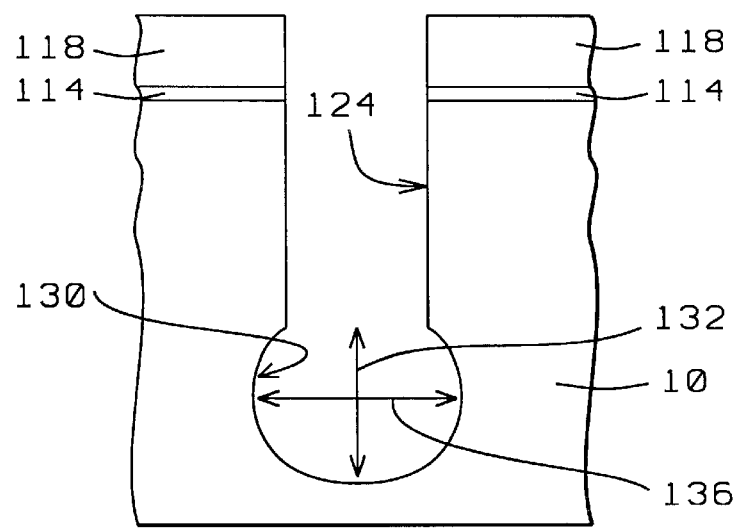
Figure 7:
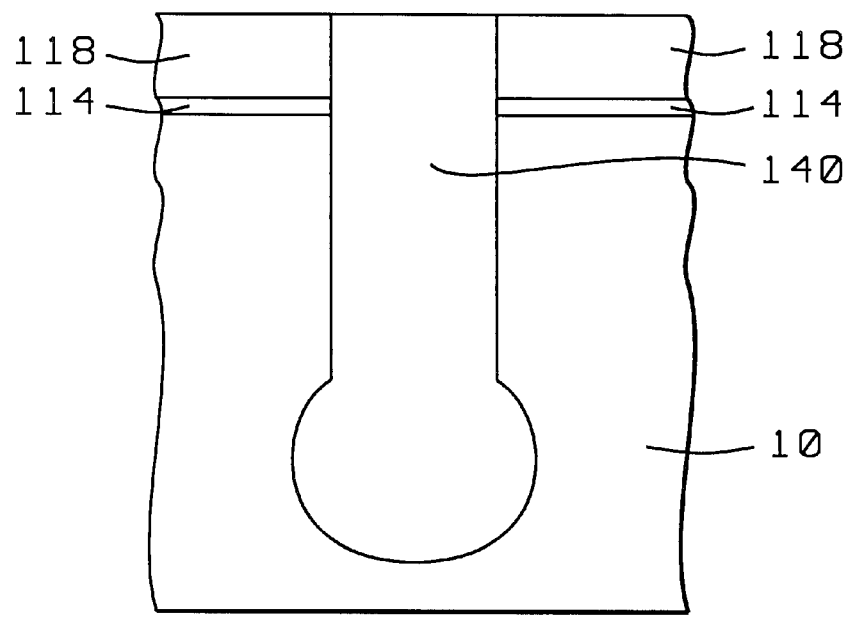

The second embodiment is shown in FIGS. 5 to 7. The second embodiment differs from the first embodiment by forming a trench 124 in the substrate before the dopant implant (See FIG. 5). Unless otherwise specified, the processes are the same as describe above in the first embodiment.

As shown in FIG. 5, we form barrier layer 14 18 over a substrate 10. The barrier layer comprised of a pad oxide layer 14 with an overlying nitride layer 18.

Next, forming an isolation opening 122 in the barrier layer 14 18. The isolation opening 122 preferably has a width of between about 0.1 and 10 $\mu$m.

In a critical step, as shown in FIG. 5, we etch a trench 124 into the substrate 10 through the isolation opening 122. The trench 124 preferably has a depth in a range of between about 0.1 and 0.2 $\mu$m and a width in a range of between about 0.1 and 10 $\mu$m.

Still referring to FIG. 5, we implant ions into the substrate 10 through the trench 124 to form a first region 126 (either doped or non-crystalline (amorphized). The ions are preferably boron ions to form a doped region. The implant is preferably an angled implant.

The implanting of ions into the substrate comprises implanting boron ions at an energy between about 5 and 20 kev. at a dose between 5E14 and 5E15 ions/$cm^2$ and at an angle (to vertical) between 0 and 20 degrees. The doped region 126 has a depth 132 in a range of between about 0.1 and 0.3 $\mu$m and a maximum width 136 of between about 0.1 and 0.2 $\mu$m larger than the width at the surface and a concentration in a range of between about 1E19 and 1E20 atom/cc.

As shown in FIG. 6, we selectively etch the doped region 126 to form a hole 130 (e.g., undercut region). The hole 130 has a depth 132 below the trench in a range of between about 0.1 and 0.3 µm and a maximum width 136 of between about 0.1 and 0.2 µm larger than the width at the surface.

As shown in FIG. 7, the hole 130 and trench 124 are filled with a insulating material to form a balloon shaped shallow trench isolation (STI) region 140. The hole 130 and the trench 124 are preferably filled with oxide using a HDPCVD process.

III. 3$^{rd}$ Embodiment—(FIGS. 8 to 11)

The 3$^{rd}$ embodiment forms a liner 223 in the trench 224 before an optional Ion implantation. (See FIGS. 8 to 11). Unless otherwise specified, the processes are the same as describe above in the first and second embodiments.

Figure 8:
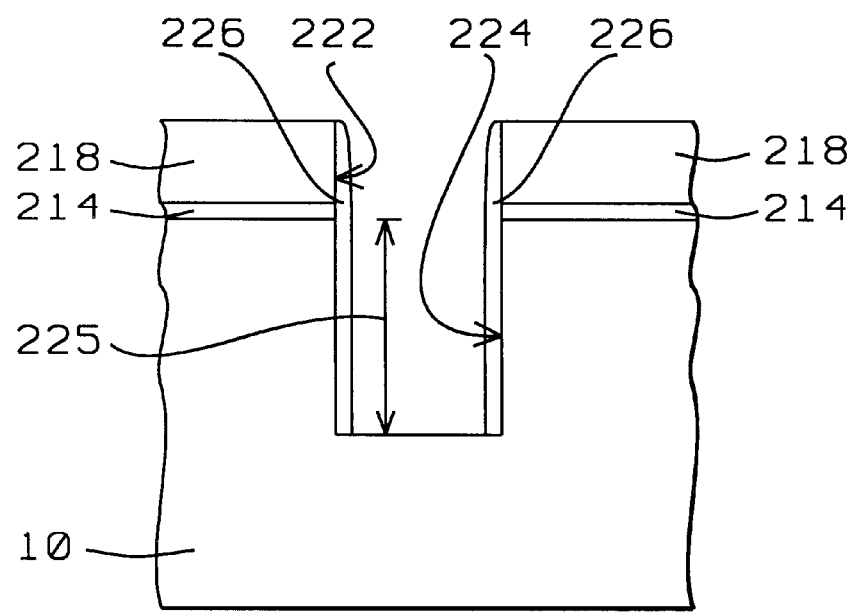
FIGS. 8 through 11 are cross sectional views for illustrating a third embodiment for manufacturing a balloon shaped shallow trench isolation (STI) region according to the present invention.

As shown in FIG. 8, we form barrier layer 214 218 over a substrate 10. The barrier layer is preferably comprised of a pad oxide layer 214 with an overlying nitride layer 218.

Next, we forming an isolation opening 222 in the barrier layer 14 18. The isolation opening 222 has a width of between about 0.1 and 10 µm.

As shown in FIG. 5, we etch a trench 224 into the substrate 10 through the isolation opening 122. the trench having sidewalls and a bottom. The trench 224 had a depth in a range of between about 0.1 and 0.2 and a width in a range of between about 0.1 and 10 µm.

In a critical step, we form a liner 223 on the sidewalls of the trench 224. The liner 223 comprised of silicon nitride and has a thickness of between about 200 and 500 Å. The liner is important because it protects the sidewall during the subsequent isotropic etch.

The liner 223 is formed by depositing a liner layer over the barrier layer 214 218 and the sidewalls and bottom of the trench. Next, we anisotropically etch the liner layer to leave a liner only on the sidewalls of the trench.

Figure 9:
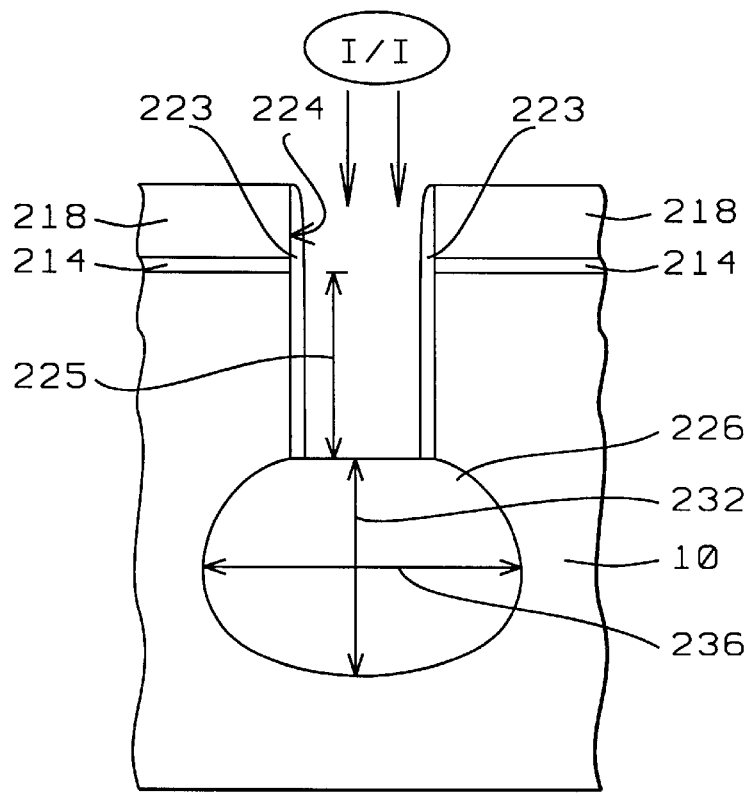

As shown in FIG. 9, in an optional step, we implant ions into the substrate through the trench 224 to form a doped or amorphized region 226. See the second embodiment for preferred parameters for the implant.

Figure 10:
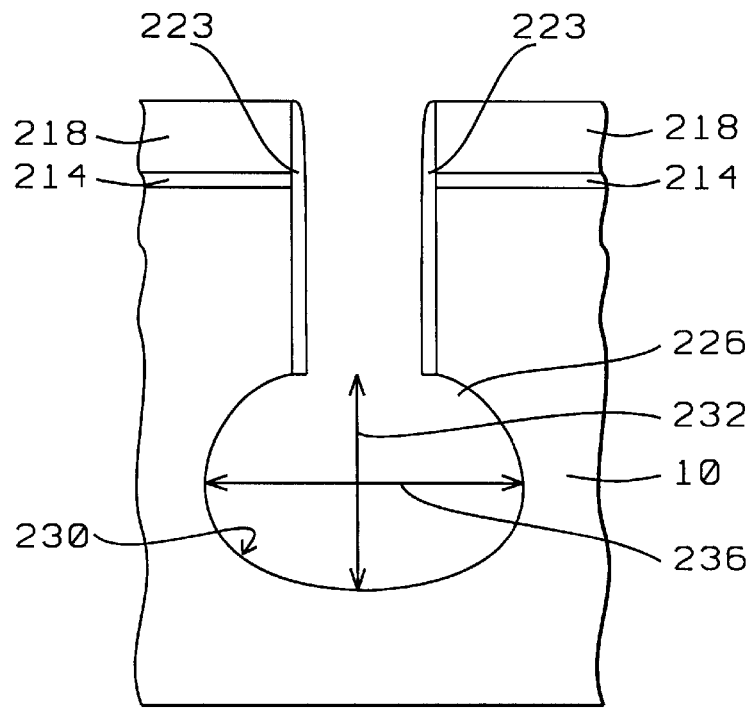

As shown in FIG. 10, we selectively etch the substrate (or the doped region 226 if the implant was used) to form a hole 230 (e.g., undercut region). The liner prevents the sidewall from being etched. The hole 230 has a depth 232 below the trench in a range of between about 0.2 and 0.3 µm and a maximum width 236 of between about 0.1 and 0.2 wider that the width at the surface.

Figure 11:
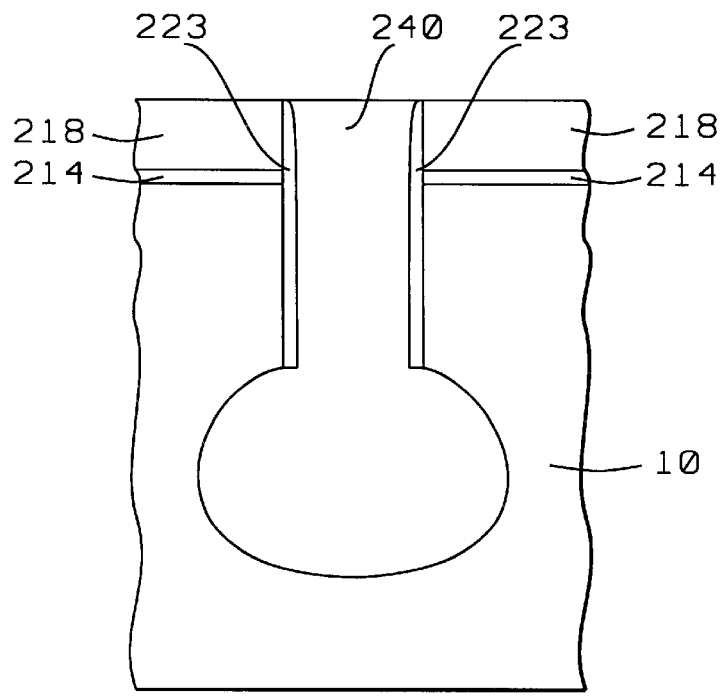
Figure 12:
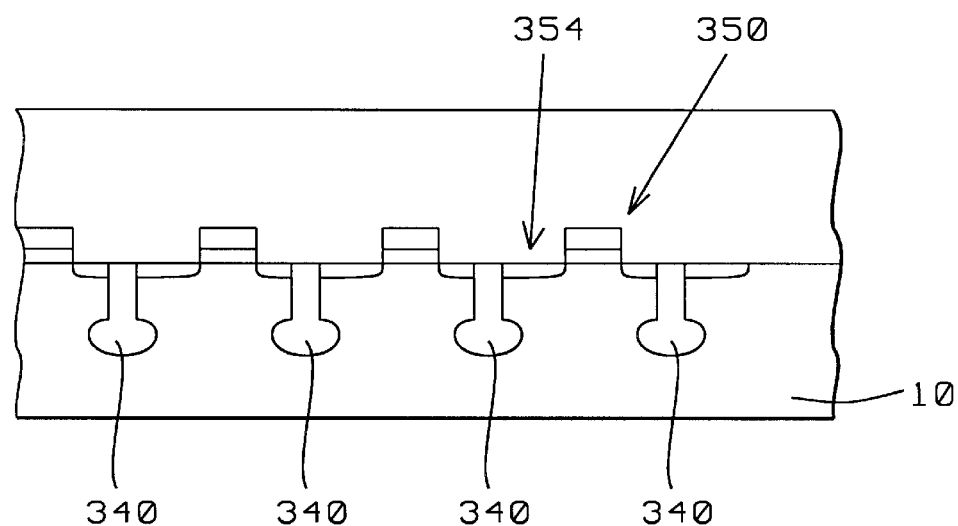
FIG. 12 is a cross sectional view for illustrating a final product with logic CMOS devices for all third embodiments for manufacturing a balloon shaped shallow trench isolation (STI) region according to the present invention.

As shown in FIG. 11, we fill the hole 230 and trench 224 with an insulating material to form a balloon shaped shallow trench isolation (STI) 240 region.

The hole 230 and the trench 224 is filled with oxide using a HDPCVD process.

IV. Advantages of the Invention

Another critical feature of the invention is that the STI region is narrower at the top (near the substrate surface) than below the surface (more than 0.2 µm below). For example, the balloon shaped shallow trench isolation (STI) regions 40 is narrower at a depth of about 0.1 µm (e.g., near the surface) between the surface of the substrate than at the at a depth of about 0.2 µm.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a balloon shaped shallow trench isolation; comprising the steps of:
   a) forming barrier layer over a substrate;
   b) forming an isolation opening in said barrier layer;
   c) implanting ions into said substrate through said isolation opening to form a first region; said first region is either doped with an impurity or amorphized substrate;
   d) selectively etching said first region to form a hole; and
   e) filling said hole with a insulating material to form a balloon shaped shallow trench isolation regions; said substrate having active areas between said balloon shaped shallow trench isolation regions.

2. The method of claim 1 wherein said barrier layer is comprised of a pad oxide layer with an overlying nitride layer.

3. The method of claim 1 wherein said isolation opening has a width of between about 0.1 and 10 µm.

4. The method of claim 1 wherein and the implanting of ions into said substrate comprises implanting boron ions at an energy between about 10 and 50 Kev; at a dose between 5E14 and 5E15 atom/cm$^2$; and at an angle to vertical between 0 and 30 degrees.

5. The method of claim 1 wherein said first region has a depth in a range of between about 0.2 and 0.4 and a maximum width of between about 0.1 and 0.2 wider than the width at the substrate surface and a concentration in a range of between about 1E19 and 1E20 atom/cc.

6. The method of claim 1 wherein said hole has a depth in a range of between about 0.2 and 0.4 and a maximum width of between about 0.1 and 0.2 wider than the width at the surface and a width at the substrate surface between 0.1 and 10 µm.

7. The method of claim 1 wherein said hole is filled with oxide using a HDPCVD process.

8. The method of claim 1 wherein said balloon shaped shallow trench isolation regions is narrower at a depth of about 0.1 µm near the surface between the surface of said substrate than at the at a depth of about 0.5 µm.

9. A method of fabricating a balloon shaped shallow trench isolation; comprising the steps of:

a) forming barrier layer over a substrate;
   (1) said barrier layer is comprised of a pad oxide layer with an overlying nitride layer;
b) forming an isolation opening in said barrier layer;
   (1) said isolation opening has a width of between about 0.1 and 10 µm;
c) implanting ions into said substrate through said isolation opening to form a doped region;
   (1) the implanting of ions into said substrate comprises implanting boron ions and at an angle to vertical between 0 and 30 degrees;
d) selectively etching said doped region to form a hole;
   (1) said hole has a depth in a range of between about 0.2 and 0.4 µm and a maximum width of between about 0.1 and 0.2 µm wider that the wide at the substrate surface and a width at the substrate surface between 0.1 and 10 µm;
e) filling said hole with a insulating material to form a balloon shaped shallow trench isolation regions; said substrate having active areas between said balloon shaped shallow trench isolation regions; said hole is filled with oxide using a HDPCVD process.

10. The method of claim 9 wherein said balloon shaped shallow trench isolation regions is narrower at a depth of about 0.1 µm (.e.g., near the surface) between the surface of said substrate than at the at a depth of about 0.5 µm.

11. A method of fabricating a balloon shaped shallow trench isolation; comprising the steps of:
   a) forming barrier layer over a substrate;
   b) forming an isolation opening in said barrier layer;
   c) etching a trench into said substrate through said isolation opening;
   d) implanting ions into said substrate through said trench to form a first region; said first region is either doped with an impurity or an amorphized substrate region;
   e) selectively etching said first region to form a hole;
   f) filling said hole and trench with a insulating material to form a balloon shaped shallow trench isolation region.

12. The method of claim 11 wherein said barrier layer comprised of a pad oxide layer with an overlying nitride layer.

13. The method of claim 11 wherein said isolation opening has a width of between about 0.1 and 10 µm.

14. The method of claim 11 wherein said trench has a depth in a range of between about 0.1 and 0.2 µm and a width in a range of between about 0.1 and 10 µm.

15. The method of claim 11 wherein the implanting of ions into said substrate comprises implanting boron ions, and at an angle (to vertical) between 0 and 30 degrees.

16. The method of claim 11 wherein said hole has a depth below the trench in a range of between about 0.1 and 0.3 and a maximum width of between about 0.1 and 0.2 larger that the width of said trench.

17. The method of claim 11 wherein said hole and said trench is filled with oxide using a HDPCVD process.

18. The method of claim 11 wherein said balloon shaped shallow trench isolation regions 40 is narrower at a depth of about 0.1 µm (.e.g., near the surface) between the surface of said substrate than at the at a depth of about 0.5 µm.

19. A method of fabricating a balloon shaped shallow trench isolation; comprising the steps of:
   a) forming barrier layer over a substrate;
      (1) said barrier layer comprised of a pad oxide layer with an overlying nitride layer;
   b) forming an isolation opening in said barrier layer;
      (1) said isolation opening has a width of between about 0.1 and 10 µm;
   c) etching a trench into said substrate through said isolation opening;
      (1) said trench has a depth in a range of between about 0.1 and 0.2 µm and a width in a range of between about 0.1 and 10 µm;
   d) implanting ions into said substrate through said trench to form a doped region;
      (1) the implanting of ions into said substrate comprises implanting boron ions;
   e) selectively etching said doped region to form a hole;
      (1) said hole has a depth below the trench in a range of between about 0.1 and 0.2 and a maximum width of between about 0.1 and 0.2 wider than said trench;
   f) filling said hole and trench with a insulating material to form a balloon shaped shallow trench isolation region.
      (1) said hole and said trench is filled with oxide using a HDPCVD process.

20. The method of claim 19 wherein said balloon shaped shallow trench isolation regions is narrower at a depth of about 0.1 µm (.e.g., near the surface) between the surface of said substrate than at the at a depth of about 0.5 µm.

21. A method of fabricating a balloon shaped shallow trench isolation; comprising the steps of:
   a) forming barrier layer over a substrate;
   b) forming an isolation opening in said barrier layer;
   c) etching a trench into said substrate through said isolation opening; said trench having sidewalls and a bottom;
   d) forming a liner on said sidewalls of said trench;
   e) etching said substrate through said trench to form a hole; and
   f) filling said hole and trench with a insulating material to form a balloon shaped shallow trench isolation region.

22. The method of claim 21 which further includes after step (d) and before step (e) implanting ions into said substrate through said trench to form a doped region.

23. The method of claim 21 wherein said barrier layer comprised of a pad oxide layer with an overlying nitride layer.

24. The method of claim 21 wherein said isolation opening has a width of between about 0.1 and 10 µm.

25. The method of claim 21 wherein said trench had a depth in a range of between about 0.1 and 0.2 µm and a width in a range of between about 0.1 and 10 µm.

26. The method of claim 21 wherein said liner comprised of silicon nitride and has a thickness of between about 200 and 500 Å.

27. The method of claim 21 wherein said liner is formed by depositing a liner layer over the barrier layer and said sidewalls and bottom of said trench; and anisotropically etching said liner layer to leave a liner only on the sidewalls of said trench.

28. The method of claim 21 wherein said hole and said trench is filled with oxide using a HDPCVD process.

29. The method of claim 21 wherein said balloon shaped shallow trench isolation regions is narrower at a depth of about 0.1 µm between the surface of said substrate than at the at a depth of about 0.5 µm.

30. A method of fabricating a balloon shaped shallow trench isolation; comprising the steps of:
   a) forming barrier layer over a substrate;
      (1) said barrier layer comprised of a pad oxide layer with an overlying nitride layer;

b) forming an isolation opening in said barrier layer;
   (1) said isolation opening has a width of between about 0.1 and 0.2 $\mu$m;
c) etching a trench into said substrate through said isolation opening; said trench having sidewalls and a bottom;
   (1) said trench had a depth in a range of between about 0.1 and 0.2 and a width in a range of between about 0.1 and 10 $\mu$m;
d) forming a liner on said sidewalls of said trench;
   (1) said liner comprised of silicon nitride and has a thickness of between about 200 and 500 Å;
   (2) said liner is formed by depositing a liner layer over the barrier layer and said sidewalls and bottom of said trench; and anisotropically etching said liner layer to leave a liner only on the sidewalls of said trench;
e) implanting ions into said substrate through said trench to form a doped region;
f) selectively etching said doped region to form a hole;
   (1) said hole has a depth below the trench in a range of between about 0.2 and 0.3 $\mu$m
g) filling said hole and trench with a insulating material to form a balloon shaped shallow trench isolation region;
   (1) said hole and said trench is filled with oxide using a HDPCVD process.

* * * * *